United States Patent
Levine et al.

(10) Patent No.: US 8,946,818 B2
(45) Date of Patent: Feb. 3, 2015

(54) DARK CURRENT REDUCTION IN BACK-ILLUMINATED IMAGING SENSORS

(75) Inventors: Peter Alan Levine, West Windsor, NJ (US); Pradyumna Swain, Gaithersburg, MD (US); Mahalingam Bhaskaran, Lawrenceville, NJ (US)

(73) Assignee: SRI International, Menlo Park, CA (US)

( * ) Notice: Subject to any disclaimer, the term of this patent is extended or adjusted under 35 U.S.C. 154(b) by 565 days.

(21) Appl. No.: 12/760,895

(22) Filed: Apr. 15, 2010

(65) Prior Publication Data

US 2010/0200944 A1 Aug. 12, 2010

Related U.S. Application Data (60) Division of application No. 11/752,601, filed on May 23, 2007, now Pat. No. 7,723,215, which is a continuation-in-part of application No. 11/350,546, filed on Feb. 9, 2006, now Pat. No. 7,238,583.

(60) Provisional application No. 60/652,409, filed on Feb. 11, 2005.

(51) Int. Cl.
*H01L 27/12* (2006.01)
*H01L 27/146* (2006.01)
(Continued)

(52) U.S. Cl.
CPC ........ *H01L 27/14643* (2013.01); *H01L 27/148* (2013.01); *H01L 31/18* (2013.01); *H01L 31/1892* (2013.01); *Y02E 10/50* (2013.01)
USPC ........................................... 257/347; 257/349

(58) Field of Classification Search
CPC ..................... H01L 29/0878; H01L 27/14654; H01L 21/1083; H01L 29/76237
USPC .................................. 257/347, 349, E31.003
See application file for complete search history.

(56) References Cited

U.S. PATENT DOCUMENTS 4,753,895 A * 6/1988 Mayer et al. .................. 438/154
5,126,281 A   6/1992 Carey et al.
(Continued)

OTHER PUBLICATIONS

S.M. Sze, Physics of Semiconductor Devices, Wiley and Sons, Second Edition, pp. 32-33.*

*Primary Examiner* — Anthony Ho
(74) *Attorney, Agent, or Firm* — Marger Johnson & McCollom PC (57) ABSTRACT

A method for fabricating a back-illuminated semiconductor imaging device on a semiconductor-on-insulator substrate, and resulting imaging device is disclosed. The device includes an insulator layer; a semiconductor substrate, having an interface with the insulator layer; an epitaxial layer grown on the semiconductor substrate by epitaxial growth; and one or more imaging components in the epitaxial layer in proximity to a face of the epitaxial layer, the face being opposite the interface of the semiconductor substrate and the insulator layer, the imaging components comprising junctions within the epitaxial layer; wherein the semiconductor substrate and the epitaxial layer exhibit a net doping concentration having a maximum value at a predetermined distance from the interface of the insulating layer and the semiconductor substrate and which decreases monotonically on both sides of the profile from the maximum value within a portion of the semiconductor substrate and the epitaxial layer. The doping profile between the interface with the insulation layer and the peak of the doping profile functions as a "dead band" to prevent dark current carriers from penetrating to the front side of the device.

13 Claims, 5 Drawing Sheets

(51) Int. Cl.
*H01L 27/148* (2006.01)
*H01L 31/18* (2006.01)

(56) References Cited

U.S. PATENT DOCUMENTS

| | | |
|---|---|---|
| 5,227,313 A | 7/1993 | Gluck et al. |
| 5,270,221 A | 12/1993 | Garcia et al. |
| 6,020,646 A * | 2/2000 | Boyle et al. ............ 257/783 |
| 6,498,073 B2 | 12/2002 | Sarma et al. |
| 7,005,637 B2 * | 2/2006 | Costello et al. ............ 250/305 |
| 7,160,753 B2 | 1/2007 | Williams et al. |
| 2005/0079690 A1 | 4/2005 | Suka et al. |
| 2005/0205930 A1 | 9/2005 | Williams et al. |
| 2006/0006488 A1 * | 1/2006 | Kanbe ............ 257/443 |
| 2006/0076590 A1 | 4/2006 | Pain et al. |

* cited by examiner

DARK CURRENT REDUCTION IN BACK-ILLUMINATED IMAGING SENSORS

CROSS-REFERENCE TO RELATED APPLICATIONS

This application is a divisional application of U.S. Non-Provisional application Ser. No. 11/752,601, filed May 23, 2007, which is a continuation-in-part of U.S. patent application Ser. No. 11/350,546, filed on Feb. 9, 2006 now U.S. Pat. No. 7,238,583, which in turn claims the benefit of U.S. Provisional Application No. 60/652,409 filed on Feb. 11, 2005. The entire disclosures of U.S. patent application Ser. No. 11/752,601, U.S. patent application Ser. No. 11/350,546, and U.S. Provisional Application No. 60/652,409 are hereby incorporated by reference herein.

FIELD OF THE INVENTION

The field of invention is semiconductor device fabrication and device structure. More specifically, the field is fabrication and structure of back-illuminated semiconductor imaging devices, with emphasis on the reduction of dark current.

BACKGROUND OF THE INVENTION

Thinned, back illuminated, semiconductor imaging devices are advantageous over front-illuminated imagers for high fill factor and better overall efficiency of charge carrier generation and collection. A desire for such devices is that the charge carriers generated by light or other emanation incident on the backside should be driven to the front side quickly to avoid any horizontal drift, which may smear the image. It is also desirable to minimize the recombination of the generated carriers before they reach the front side, since such recombination reduces overall efficiency and sensitivity of the device.

These desires may be achieved by providing a thin semiconductor layer and a high electric field within this layer. The field should extend to the back surface, so that the generated carriers, such as electrons or holes, can be driven quickly to the front side. This requires additional treatment at the backside of the device, which adds to complexity of the fabrication process. One current technique includes chemical thinning of semiconductor wafers and deposition of a "flash gate" at the backside after thinning. This requires critical thickness control of the backside flash gate. Another technique involves growth of a thin dopant layer on a wafer back using molecular beam epitaxy (MBE). Still another known method used to provide a desired electric field is to create a gradient of doping inside the thinned semiconductor layer by backside implant of the layer followed by appropriate heat treatment for annealing and activation.

These methods can not be easily included in conventional semiconductor foundry processing, and require more expensive custom processing. They are therefore often not cost-effective and not suitable for commercial manufacturing.

Back-illuminated imaging devices may be designed to operate at wavelengths ranging from less than 100 nanometers (deep ultraviolet) to more than 3000 nanometers (far infrared). An important factor that affects the sensitivity of back illuminated imagers is the absorption depth of radiation in the semiconductor bulk. In general, the radiation will be absorbed within a region close to the back surface of the device. For maximum device efficiency, all charge carriers generated in this region must reach optical detection components situated on the opposing front side of the device. A general method that is employed to increase the sensitivity of a thinned back-illuminated imager is to implant p-type or n-type dopant at the backside and, with later heat treatments, create a dopant concentration profile which decreases in the direction toward the front side of the thin substrate. In the case of p-type doping, such doping concentration gradient gives rise to an electric field tending to drive light-generated electrons toward the front side. In the case of n-type doping, such doping concentration gradient gives rise to an electric field tending to drive light-generated holes toward the front side.

Another problem encountered with the design and operation of back-illuminated imagers is the presence of dark current. Dark current is the generation of carriers (electrons or holes), exhibited by a back-illuminated imager during periods when the imager is not actively being exposed to light. Dark current is detrimental to back-illuminated imager operation because excess dark current signal collected along with a desired optically generated signal results in higher levels of fixed pattern and excess random shot noise. The offset signal produced by dark current is seen as a non-uniform shading in a displayed image. Assuming that an imager employs signal electrons, the excess dark current noise is proportional to the square root of the number of dark current electrons in a pixel. Since dark current noise is uncorrelated with other imager noise sources, the noise due to dark current adds to the overall noise from other sources in quadrature. Dark current noise increases with increased temperature.

Accordingly, what would be desirable, but has not yet been provided, is a device and method for effectively reducing the amount of dark current reaching front imaging components in back-illuminated imaging devices.

SUMMARY OF THE INVENTION

Disclosed is a method and resulting back-illuminated imaging device employing Semiconductor-on-insulator (UT-SOI) substrates and having a resulting low dark current which includes an insulator layer; a semiconductor substrate, having an interface with the insulator layer; an epitaxial layer grown on the semiconductor substrate by epitaxial growth; and one or more imaging components in the epitaxial layer in proximity to a face of the epitaxial layer, the face being opposite the interface of the semiconductor substrate and the insulator layer, the imaging components comprising junctions within the epitaxial layer; wherein the semiconductor substrate and the epitaxial layer exhibit a net doping concentration having a maximum value at a predetermined distance from the interface of the insulating layer and the semiconductor substrate and which decreases montonically on both sides of the profile from the maximum value within a portion of the semiconductor substrate and the epitaxial layer. The doping profile between the interface with the insulation layer and the peak of the doping profile functions as a "dead band" to prevent dark current carriers from penetrating to the front side of the device.

The doping profile has an approximately Gaussian shape. The maximum value of the net dopant concentration profile is high enough such that a potential barrier corresponding to the doping maximum is at least about 10 times greater than kT, where k is the Botzmann constant and T is absolute temperature in Kelvins so as to prevent dark current carriers from having enough energy to penetrate to the front side via thermionic emission. The insulation layer itself can function as an anti-reflection coating. In another embodiment, at least one layer of a material is deposited on a side of the insulating layer opposite the semiconductor substrate which functions as an anti-reflection coating for electromagnetic radiation over a predetermined range of wavelengths. In still another embodiment, the insulation layer is completely removed and at least one layer of a material is deposited on the semiconductor substrate which acts as an anti-reflection coating.

The method for manufacturing the back-illuminated imager is compatible with conventional semiconductor foundry processing. Starting with a UTSOI substrate, a semiconductor layer having a graded doping profile is created before front-side component fabrication. The method includes the steps of providing a substrate comprising a mechanical substrate, an insulator layer, and a semiconductor substrate; growing an epitaxial layer on the semiconductor substrate while simultaneously causing diffusion of the one or more dopants into the epitaxial layer such that, at completion of the growing of the epitaxial layer, there exists a net dopant concentration profile in the semiconductor substrate and the epitaxial layer which has a maximum value at a predetermined distance from the interface of the insulating layer and the semiconductor substrate and which decreases montonically on both sides of the profile from the maximum value within the semiconductor substrate and the epitaxial layer; and fabricating one or more imaging components in the epitaxial layer. In another embodiment, the method further includes the steps of growing a second insulation layer on the semiconductor substrate before the fabricating one or more imaging components in the epitaxial layer; implanting doping ions through the second insulation layer; and removing the second insulation layer.

DETAILED DESCRIPTION OF THE INVENTION

The following embodiments are intended as exemplary, and not limiting. In keeping with common practice, figures are not necessarily drawn to scale.

Figure 1A:
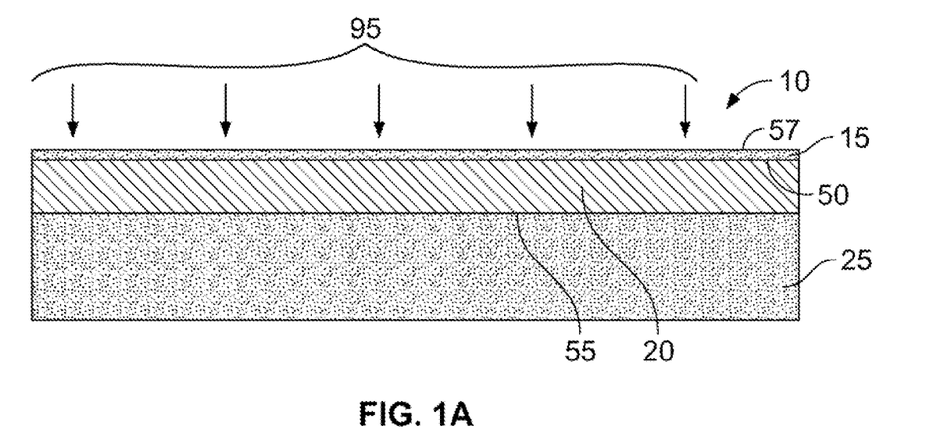
FIGS. 1A, 1B, 1C, 1D, and 1E show an embodiment of process for fabricating a back-illuminated imaging device on a UTSOI substrate.
Figure 1B:
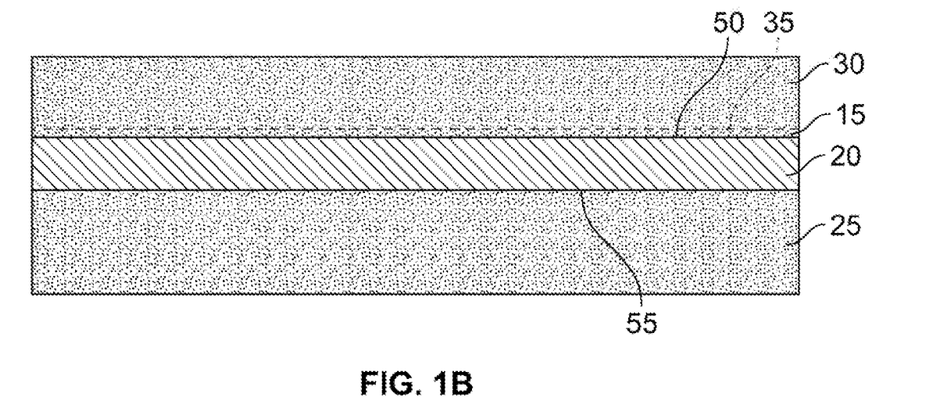
Figure 1C:
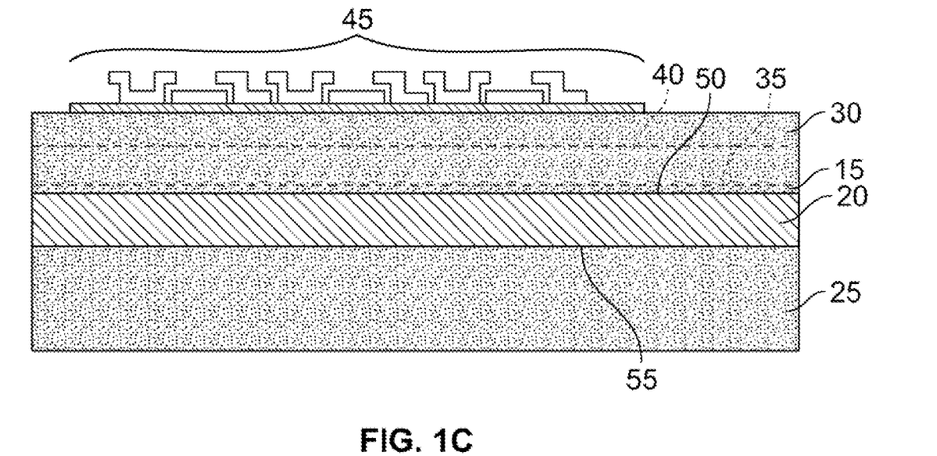
Figure 1D:
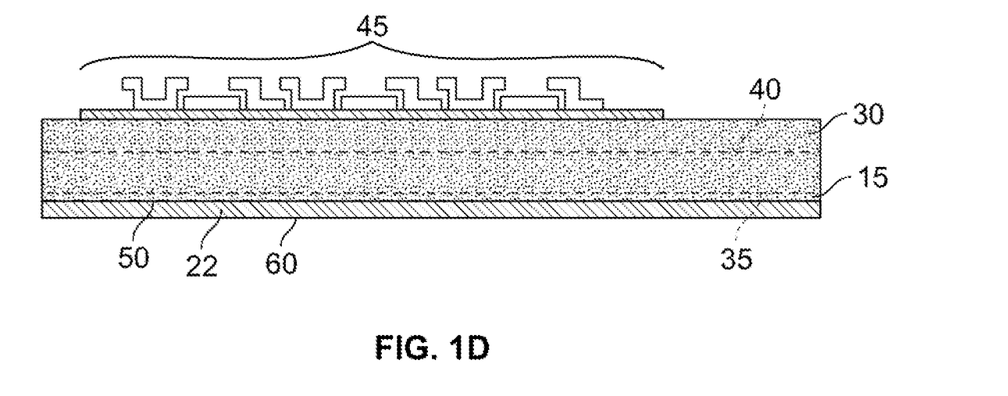
Figure 1E:
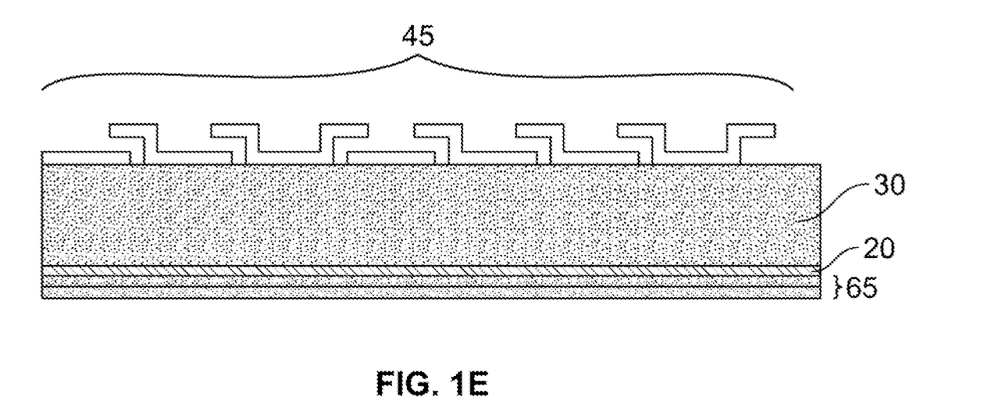

FIGS. 1A, 1B, 1C, and 1D illustrate an embodiment of a process and a resulting structure. FIG. 1A illustrates initial substrate 10 sometimes referred to in the art as an ultra-thin semiconductor-on-insulator (UTSOI) substrate. FIG. 1B illustrates the state of process embodiment following growth of epitaxial layer 30. FIG. 1C illustrates the state of process embodiment following a step of fabrication of imaging components 45 on and in epitaxial layer 30. As part of this step, one or more electrical junctions, or "pn-junctions" 40 are formed in epitaxial layer 30. FIG. 1D illustrates a completed state of the process and the resulting imaging device. FIG. 1E illustrates the state of process embodiment following an optional step of growing one or more anti-reflective coatings. Details of each step follow.

Starting UTSOI substrate 10, shown in FIG. 1A, is composed of mechanical substrate 25 (handle wafer) to provide mechanical support during processing, insulator layer 20 (which can be, for example, a buried oxide layer of silicon), and semiconductor substrate 15 (seed layer). In this embodiment mechanical substrate 25 may be a standard silicon wafer used in fabricating integrated circuits. Alternatively, mechanical substrate 25 may be any sufficiently rigid substrate composed of a material which is compatible with the steps of the method disclosed here. Insulator layer 20 may comprise an oxide of silicon with a thickness of about 1 micrometer in this embodiment. Among other embodiments, thickness of insulator layer 20 may fall in a range from about 10 nm to about 5000 nm. Semiconductor substrate 15 may be comprised of crystalline silicon having a thickness from about 5 nanometers to about 100 nanometers.

UTSOI substrates are available commercially and are manufactured by various known methods. In one method, thermal silicon oxide is grown on silicon wafers. Two such wafers are joined with oxidized faces in contact and raised to a high temperature. In some variations, an electric potential difference is applied across the two wafers and the oxides. The effect of these treatments is to cause the oxide layers on the two wafers to flow into each other, forming a monolithic bond between the wafers. Once the bonding is complete, the silicon on one side is lapped and polished to the desired thickness of semiconductor substrate 15, while the silicon on the opposite side of the oxide forms mechanical substrate 25. The oxide forms insulator layer 20.

Another method of fabricating a UTSOI substrate begins with obtaining a more standard semiconductor-on-insulator (SOI) wafer in which the semiconductor substrate (corresponding to 15 in FIG. 1A) has a thickness in the range from about 100 nm to about 1000 nm. A thermal oxide is grown on the semiconductor substrate, using known methods. As the oxide layer grows, semiconductor material of the semiconductor substrate is consumed. Then the oxide layer is selectively etched off, leaving a thinned semiconductor substrate having a desired UTSOI thickness.

UTSOI substrates manufactured by an alternative method, known as Smart Cut™, are sold by Soitec, S. A.

Semiconductor substrate 15 may comprise silicon (Si), Germanium (Ge), SiGe alloy, a III-V semiconductor, a II-VI semiconductor, or any other semiconductor material suitable for the fabrication of optoelectronic devices.

Before further processing, semiconductor substrate 15 is doped. The purpose of this doping is to provide a source of at least one dopant which will form a desired dopant profile in later processing steps, as explained below. This initial doping may be accomplished in several known ways, such as diffusion from a gas, applying dopant directly to a surface of a semiconductor, or incorporating dopants during the formation of an ingot which is then cut into wafers. In addition, doping of semiconductor substrate 15 may be carried at any of various stages of making substrate 10. As one example, one or more dopants may be introduced during the formation of the ingot from which the wafer used to make semiconductor substrate 15 is cut. Alternatively, dopants could be introduced to that wafer after it is cut from the ingot.

In another alternative, depicted in FIG. 1A, one or more dopants are introduced to semiconductor substrate 15 after this substrate is formed. This alternative is shown schematically in FIG. 1A. Dopants 95 may be introduced into semiconductor substrate 15 by applying them through a face 57 opposite the interface 50 of semiconductor substrate 15 and insulator layer 20. Dopants 95 may be applied to face 57 by any of several known methods. As one example, dopants 95 may be diffused into semiconductor substrate 15 by immersing the entire starting substrate 10 in a furnace containing ambient gas which contains dopant. Alternatively, dopants 95 may be applied to face 57 in the form of a doped glass. A heat treatment then drives dopant from the glass into semiconductor substrate 15. The glass is then removed. In yet another example, dopants are implanted into semiconductor substrate 15 and then driven and activated by a heat treatment.

Dopants 95 are introduced into semiconductor substrate 15 in sufficient concentration to produce a desired net doping profile, as will be explained in more detail below. The initial net doping concentration in semiconductor substrate 15 may be on the order of $10^{17}$ charge carriers per cubic centimeter or higher, and may be either p-type or n-type. Common dopants include boron, phosphorous, antimony, and arsenic.

Referring to FIG. 1B, epitaxial layer 30 is then grown on top of doped semiconductor substrate 15 using semiconductor substrate 15 as the template. Depending on the material of semiconductor substrate 15, epitaxial layer may comprise silicon (Si), Germanium (Ge), SiGe alloy, a III-V semiconductor, a II-VI semiconductor, or any other semiconductor material suitable for the fabrication of optoelectronic devices. Epitaxial layer 30 may have a thickness from about 1 micrometer to about 400 micrometers (depending on the wavelength or other properties of the radiation being detected), and provides a layer for fabricating front side components (45 in FIGS. 1C, 1D) which complete the overall imaging device. Still referring to FIG. 1B, during the growth of epitaxial layer 30, dopants previously introduced into semiconductor substrate 15 diffuse into epitaxial layer 30. In one embodiment, disclosed in detail below in connection with FIGS. 2-4, epitaxial layer 30 is grown at a temperature at or above 1000° C. At the conclusion of the growth, the net doping profile is very close to the desired profile, in that at each distance from interface 50, within the semiconductor substrate 15 and epitaxial layer 30, the net carrier concentration is close to its final desired value. All remaining steps in the process are then carried out at lower temperatures, so that relatively little diffusion of dopants takes place, and the profile is essentially unchanged at the end of the process. In an alternative embodiment, the profile immediately after growth of epitaxial layer 30 is significantly different from the desired one, but significant diffusion of dopants in later process steps results in the desired profile at the end of the process.

A goal of the exemplary process is the creation of a final net dopant concentration profile in semiconductor substrate 15 and epitaxial layer 30 which has a maximum value at interface 50 of semiconductor substrate 15 and insulator layer 20. It is also a goal that a final net dopant concentration profile desirably decreases monotonically with increasing distance from interface 50 within a portion of semiconductor substrate 15 and epitaxial layer 30 between interface 50 and junctions 40 shown in FIGS. 1C and 1D. (Junctions 40 are created during fabrication of front-side components 45, shown in FIGS. 1C and 1D.) Such a profile will give rise to an electric field within semiconductor substrate 15 and epitaxial layer 30 tending to drive photo-generated electrons toward the front side imaging components 45 and minimizing the trapping of these electrons near the backside.

It has been found that in back-illuminated devices having doping concentrations of the magnitude disclosed here (below) at the interface 50 of the semiconductor substrate and the insulator layer, the quantum efficiency of the device is more stable with respect to time and incident flux than in other similar imaging devices. This may be because essentially all charge-trapping states in the interface are initially filled from the dopant and remain filled, rather than becoming gradually filled over time while the device is illuminated. Quantum efficiency may be defined as the average number of charge carriers generated and imaged in the device for each incident photon or particle detected.

Referring to FIG. 1C, once epitaxial layer 30 is grown, with the simultaneous formation of a desired dopant profile, one or more imaging components 45 may be fabricated using known methods of semiconductor fabrication. These imaging components may include charge-coupled device (CCD) components, CMOS imaging components, photodiodes, avalanche photodiodes, phototransistors, or other optoelectronic devices, in any combination. Components 45 may include both CCD and CMOS components fabricated in separate areas of epitaxial layer 30 using known masking methods. Also included may be other electronic components such as CMOS transistors, (not shown) bipolar transistors (not shown), capacitors (not shown), or resistors (not shown). One or more p-n junctions 40 of various depths may be formed during the fabrication of imaging components 45.

Referring to FIG. 1D, the last steps of the process include removal of mechanical substrate 25. Once the fabrication of components 45 is complete, substrate 25 is no longer needed to provide mechanical stability. Removal of mechanical substrate 25 may also be desirable in order to allow the emanation being detected to reach the backside semiconductor. Removal of mechanical substrate 25 may be accomplished by such methods as chemical etching, mechanical grinding, or a combination of these methods. With chemical etching, mechanical substrate 25 may be removed selectively, without removing insulator layer 20.

Alternatively, at least a portion of mechanical substrate 25 may be left in place (not removed) if the remaining portion at least partially transmits the radiation or particles being detected and imaged.

If mechanical substrate 25 is entirely removed, insulator layer 20 may be removed, either partially or entirely, by chemical or physical methods or a combination of the two. FIG. 1D shows partially removed insulator layer 22. In one embodiment, insulator layer 22 is made to act as an anti-reflection coating for electromagnetic waves having wavelengths in a predetermined range, thereby allowing more photons to reach, and be absorbed in, the semiconductor layers 15, 30. This may be accomplished by reducing thickness of insulator layer 20 to a thickness which minimizes reflection in the predetermined wavelength range. The thickness may be determined by the wavelength range and the index of refraction of the material of layer 20 in this wavelength range.

Referring now to FIG. 1E, in another embodiment, after partially removing the insulator layer 20, one or more anti-reflective coating layers 65 (for example, zirconium oxide or bismuth oxide) can be deposited on the insulation layer 20 to function as an overall anti-reflective coating stack 65 for a desired range of wavelengths. In still other embodiments, the insulation layer 20 can be completely etched away, and one or more anti-reflective coating layers can be deposited on the semiconductor substrate 15 so as to function as an overall antireflective coating.

In one embodiment, imaging components 45 and antireflection coating 22 may be designed to operate in an ultraviolet region of the electromagnetic spectrum, for example in the wavelength range from about 100 to 400 nanometers. Alternatively, components 45 may be designed to operate in other regions of the electromagnetic spectrum, such as the x-ray, gamma ray, or visible region. In still another embodiment, components 45 may be designed to detect charged particles, such as electrons. Imaging components 45 may be designed to detect any form of emanation capable of interacting with solid matter and producing charge carriers within semiconductor regions 15 and 30.

Figure 2:
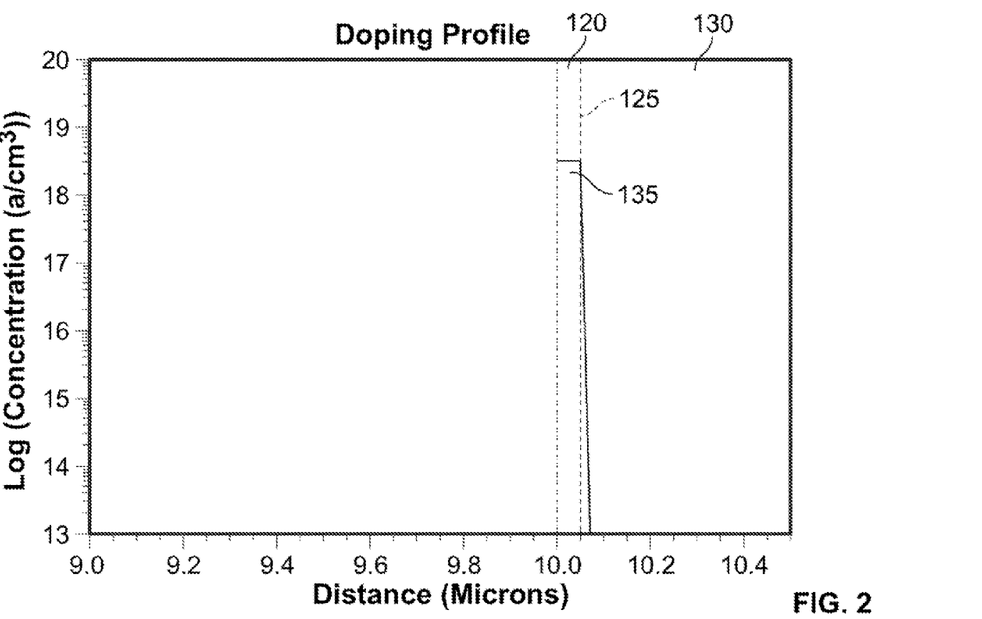
FIG. 2 shows an initial doping profile in a semiconductor substrate.
Figure 3:
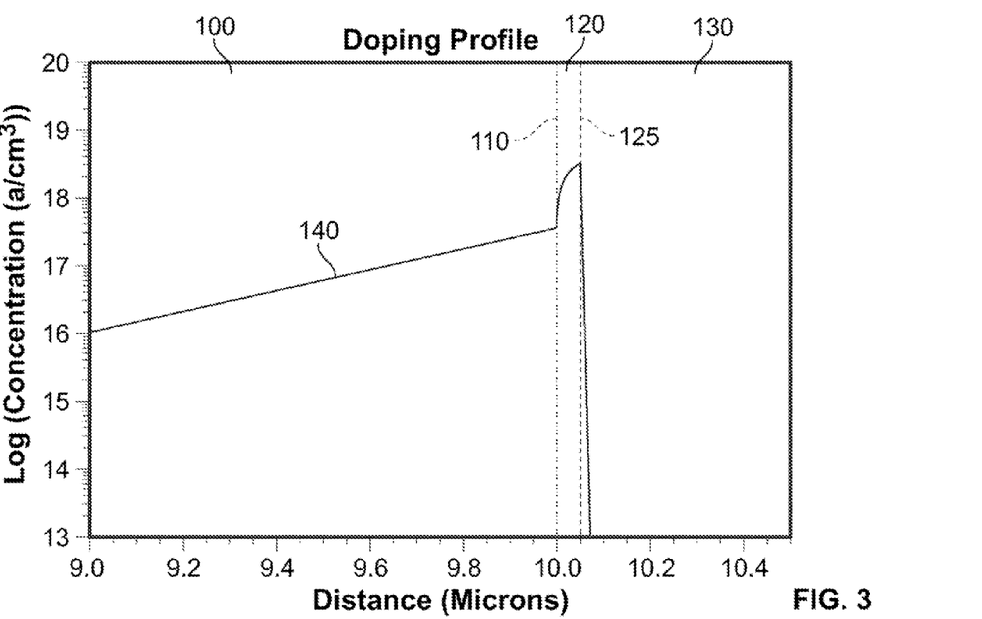
FIG. 3 shows a doping profile following growth of an epitaxial layer.
Figure 4:
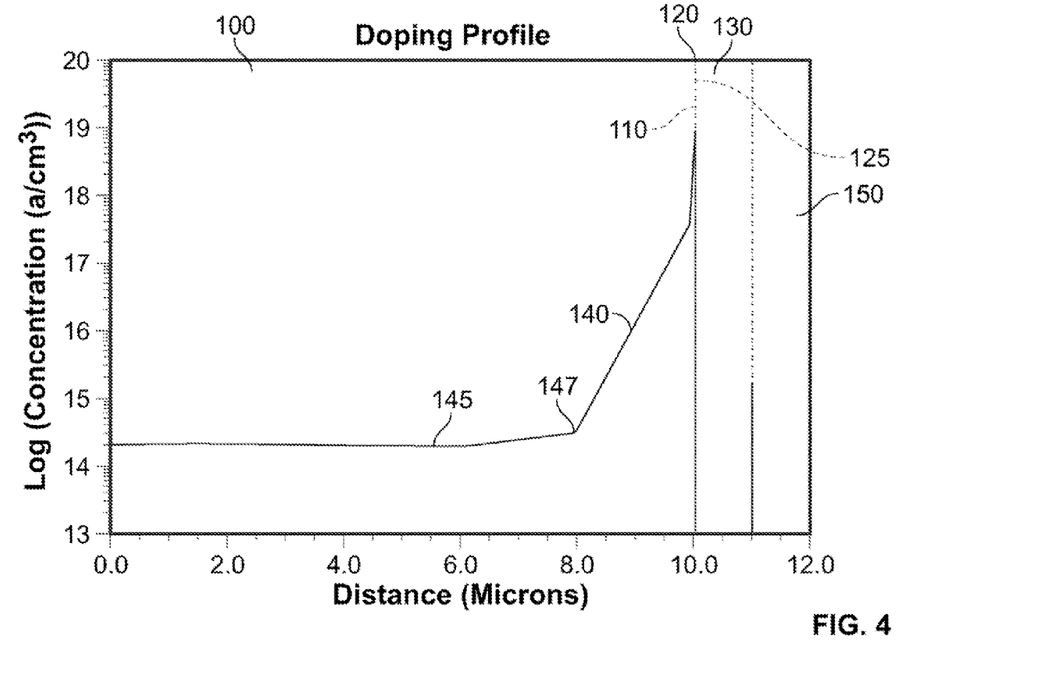
FIG. 4 shows the doping profile of FIG. 3 on a larger distance scale.

Processing parameters such as doping levels, initial doping profiles, and temperatures are chosen to give a desired doping profile, as described above. As is common in semiconductor processing, choices of values of processing parameters, such as epitaxial growth temperature, may be guided by performing computer simulations of processes and the resulting dopant profiles and internal electric fields. Such simulations may be carried out using process simulation software such as SUPREM, available from Technology Modeling Associates, Inc. FIGS. 2 through 4 show the results of computer simulations of desired net doping profiles for an embodiment of inventive process. In these figures, various regions correspond to regions of the structures shown in FIG. 1, as follows:

Region 150 corresponds to mechanical substrate 25. Region 130 corresponds insulator layer 20, comprising an oxide of silicon in this embodiment. Region 120 corresponds to semiconductor substrate 15, comprising silicon in this embodiment. Region 100 corresponds to epitaxial layer 30, comprising silicon in this embodiment. Number 125 corresponds to interface 50. Number 110 corresponds to interface 35.

FIG. 2 shows an initial doping profile 135 in semiconductor substrate 120, before growth of epitaxial layer. In this embodiment boron is used as the dopant, and it may be introduced into semiconductor substrate 120 by any of the methods for introducing dopants described above. Initial profile 135 is created by boron doping (or, equivalently, net p-type doping) with a net p-type concentration of about $1 \times 10^{19}$ carriers per cubic centimeter, assumed uniform through semiconductor substrate 120.

FIG. 3 shows a net final doping profile 140 after growth of epitaxial layer 100. The net profile 140 in this embodiment is p-type; alternatively it could be n-type. Boron atoms starting in the semiconductor substrate 120 diffuse into epitaxial layer 100 during growth of that layer to produce what will become essentially final profile 140, as discussed above. Profile 140 in this simulated process embodiment has desired features: it has a maximum value at interface 125 of the semiconductor substrate and the insulator layer and decreases monotonically with increasing distance from interface 125 within semiconductor substrate 120 and epitaxial layer 100.

FIG. 4 shows the same doping profile as FIG. 3 on a larger scale of distance, in order to show essentially the entire profile. At some distance from interface 125 the monotonically decreasing portion 140 of the profile meets the background doping level 145 in the epitaxial layer 100. The doping level remains at this value 145 all the way to the junctions 40 (not shown in FIG. 4). As long as net doping concentration 140, 145 does not increase with distance away from interface 125, carriers generated in the semiconductor substrate 120 or epitaxial layer 100 by waves or particles incident on the backside 60 will tend to be driven toward imaging components 45 and not in the opposite direction. However, to efficiently sweep photocarriers toward the imaging components 45, the electric field needs to be sufficiently high to overcome thermal diffusion in the region, known as the "spread," between the interface 125 and the location 147 where the doping concentration 140 meets the background doping concentration 145. This puts a constraint on the "spread" to be smaller than a predetermined length. Put another way, the average slope of the doping concentration (profile) 140 decreases monotonically faster than a predetermined rate. For example, the doping concentration can decreases from a value greater than 1.0 $E19/cm^3$ to less than 5.0 $E12/cm^3$ (the intrinsic doping level of the epitaxial layer 100) within a distance of approximately 3 microns or less. In another example the doping concentration can decrease from a value greater than 1.0 $E19/cm^3$ to the intrinsic doping levels within a distance that extends from the interface 125 to a front side of the epitaxial layer 100 or less.

Figure 6:
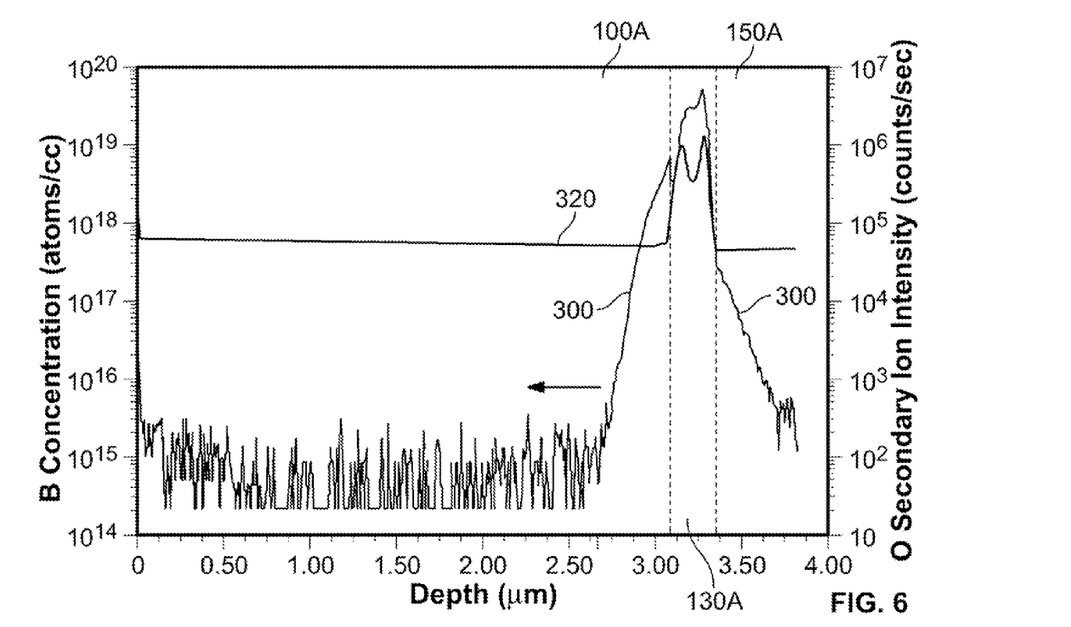
FIG. 6 shows an actual doping profile, obtained by SIMS.

FIG. 6 shows an actual doping profile obtained using Secondary Ion Mass Spectroscopy (SIMS). Two curves (300, 320) are shown. Curve 300 shows boron doping concentration variation with distance. Boron concentration is indicated on the left vertical axis. Curve 320, linked to the right vertical axis, is an indication of oxygen concentration, and serves to establish the locations corresponding to a silicon mechanical substrate 150A, a silicon oxide insulator layer 130A, and a silicon epitaxial layer 100A. As in FIGS. 2-4, vertical dashed lines indicate boundaries between these regions.

Figure 5:
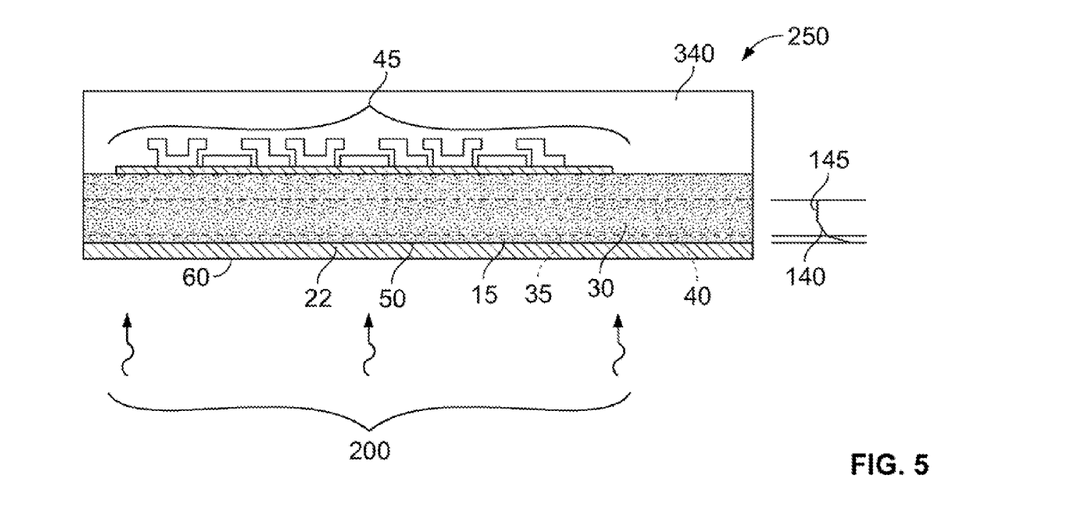
FIG. 5 shows a complete device structure and associated doping profile resulting from an embodiment of process.

FIG. 5 shows an embodiment of a complete laminated imaging device 250, with anti-reflection coating 22. For thin devices a sufficiently rigid lamination layer 340 may be added to provide mechanical stability. In the embodiment shown in FIG. 5 a lamination layer 340 is shown on the front side of the device. Lamination layer 340 may be bonded to the front side of the wafer with a cement after concluding the fabrication of imaging components 45 and other front-side components. Alternatively, the lamination layer may be bonded to the back of the device. If the lamination layer is bonded to the back of a back illuminated device, lamination layer material, any cement used to bond the lamination layer, and any other materials between the lamination layer and the back of the device must be transparent to, and not degraded by, detected radiation 200.

Waves or particles 200 are incident on face 60 of the anti-reflection coating opposite to the face of epitaxial layer 30 where the imaging components 45 are fabricated. FIG. 5 thus depicts a back-illuminated device. On the right side of FIG. 5 is a reproduction of doping profile 140, 145 shown in FIG. 4, thus indicating the doping concentration in semiconductor substrate 15 and epitaxial layer 30.

Figure 7:
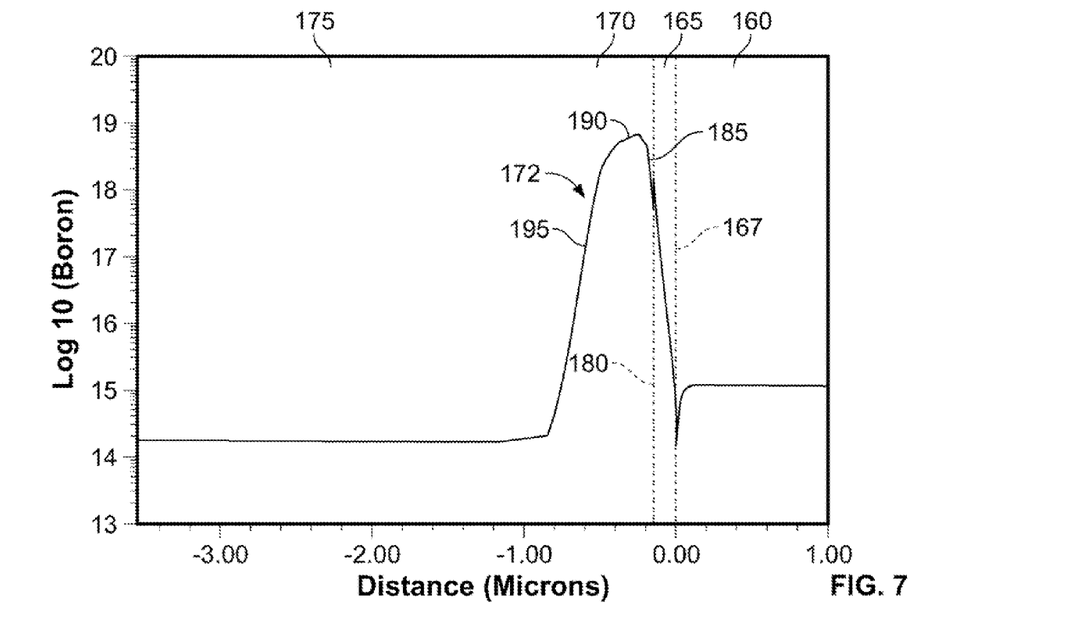
FIG. 7 shows a doping profile following the grow of an epitaxial layer using a process which reduces or eliminates dark current, according to another embodiment of the present invention.

Referring now to FIGS. 1E and 7, there is shown a desired net doping profile 172 for a back-illuminated imaging sensor fabricated on Silicon-on-Insulator (SOI) which is designed for the reduction of dark current, according to another embodiment of the present invention. Unlike the embodiment of FIGS. 1-6, the net doping profile has a peak 190 a predetermined distance from the interface 180 between the insulating (buried oxide) layer 20 and the semiconductor substrate (seed layer) 15 inside the region 170 within the semiconductor substrate 15. The doping level, which can be p-type or n-type, increase monotonically beginning at the interface 180 between the insulating layer 20 and the semiconductor substrate 15 (the doping profile is shown to monotonically increase beginning at the mechanical substrate-buried oxide boundary 167 within the region 165 inside the buried oxide layer 20, but the resultant doping profile within the region 165 inside the buried oxide layer 20 is not critical to the design of the present invention). The doping profile continues to increase monotonically in the region 185, known as the dead band, until reaching a peak 190 inside the region 170 of the semiconductor substrate 15 before monotonically decreasing, shown by the curve 195 inside the regions 170, 175 corresponding to one or both of the seed layer 15 and the epitaxial layer 30. The desired net doping profile 172 can be approximately Gaussian in shape.

Both dark current electrons and signal electrons can be influenced by the dead band-generated electric field. Processing parameters and the range of wavelength of operation are chosen to allow signal electrons to pass the dead band peak 190 toward the front components 45 while preventing dark current electrons from penetrating this barrier. The potential barrier corresponding to the doping maximum 190 should be large enough to prevent thermionic emission of dark current from moving past the doping peak 190 into the regions 170, 175. To assure negligible thermionic emission of dark current electrons over the potential barrier peak 195, the barrier peak voltage level needs to be about 10 times greater than kT, where k is the Botzmann constant and T is absolute temperature in Kelvins. For signal electrons to get past the barrier peak 190, the absorption depth of incident signal photons, which depends on their wavelength, needs to be greater than the distance of the peak 190 from the interface 180 of the semiconductor substrate 15 with the insulating layer 20.

The dead band can be created in one of two ways: a modified version of the ion-implantation method previously described or by a direct epitaxial growth/doping method. Referring again to FIG. 1A-1E, in the ion implantation method, a relatively thicker oxide layer is deposited over a relatively thicker seed layer 15. A thick oxide layer has a thickness greater than about 1000 A, while a thin oxide layer has a thickness of about 400 A or less. A relatively thick (about 1000 A for the simulation example shown in FIG. 7) seed layer 15 is used. Then a second oxide layer (not shown) is deposited on the seed layer 15. In the simulation example shown, the buried oxide (insulation layer) 20 is chosen to have a thickness of about 1450 A. The second oxide layer has a final thickness of about 1800 A. Then boron ions are implanted through the second oxide layer. The boron implant dose is set to about 6.0 E+14 ions/cm$^2$ and the implantation energy was set to about 35 KeV for this simulation. After the ion implantation step, the second oxide layer is etched away from the seed layer 15 and an epitaxial layer 30 is grown with the same method as used for the embodiment of FIGS. 1-6. This results in a profile with the dead band as shown in FIG. 7, in which the peak of the profile is about 1000 A away from the buried oxide-seed layer interface 180 inside the semiconductor substrate 15.

A similar doping profile can be obtained by appropriate custom doping during epitaxial growth on a seed layer 15. Instead of growing a second oxide layer on top of the seed layer 15 and then performing ion implantation through the second oxide layer, the dead band profile 172 of FIG. 7 can be obtained by growing an epitaxial layer 30 directly on the seed layer 15 and varying the doping concentration appropriately, as can be appreciated by those skilled in the art.

It is to be understood that the exemplary embodiments are merely illustrative of the invention and that many variations of the above-described embodiments may be devised by one skilled in the art without departing from the scope of the invention. It is therefore intended that all such variations be included within the scope of the following claims and their equivalents.

What is claimed:

1. A semiconductor device, comprising:
    an insulator layer;
    a semiconductor substrate, having an interface with the insulator layer on a first side; and
    an epitaxial layer grown on the semiconductor substrate by epitaxial growth, the epitaxial layer on a side of the semiconductor substrate opposite the first side;
    wherein the semiconductor substrate and the epitaxial layer exhibit a net doping concentration having a maximum value in the semiconductor substrate at a predetermined distance from the interface of the insulator layer and the semiconductor substrate and which increases monotonically from the interface to the maximum value and decreases monotonically towards the epitaxial layer.

2. The device of claim 1, wherein the shape of the net dopant concentration profile is approximately Gaussian.

3. The device of claim 1, wherein predetermined distance is located about 1000 angstroms from the interface of the insulating layer and the semiconductor substrate.

4. The device of claim 1, wherein at least one dopant used for creating the net dopant concentration profile is one of p-type or n-type.

5. The device of claim 1, wherein at least one dopant used for creating the net dopant concentration profile is at least one of silicon, germanium, a silicon-germanium alloy, a III-V semiconductor, and a II-VI semiconductor.

6. The device of claim 1, wherein the epitaxial layer and semiconductor substrate both comprise silicon and the insulator layer comprises an oxide of silicon.

7. The device of claim 1, wherein the semiconductor substrate comprises at least one of silicon, germanium, a silicon-germanium alloy, a III-V semiconductor, and a II-VI semiconductor.

8. The device of claim 1, wherein the epitaxial layer comprises at least one of silicon, germanium, a silicon-germanium alloy, a III-V semiconductor, and a II-VI semiconductor.

9. The device of claim 1, wherein the insulator layer has a thickness selected to function as an anti-reflection coating over a predetermined range of wavelengths.

10. The device of claim 1, further comprising at least one layer of a material deposited on a side of the insulating layer opposite the semiconductor substrate which functions as an anti-reflection coating for electromagnetic radiation over a predetermined range of wavelengths.

11. The device of claim 1, further comprising at least one semiconductor component in the epitaxial layer in proximity to a face of the epitaxial layer, the face being opposite the interface of the semiconductor substrate and the insulator layer, the at least one semiconductor component comprising at least one junction within the epitaxial layer,
    wherein the at least one semiconductor component includes at least one of a CMOS imaging component, a charge-coupled device (CCD) component, a photodiode, an avalanche photodiode, and a phototransistor.

12. The device of claim 1, wherein the semiconductor substrate has a thickness in the range from about 5 nanometers to about 100 nanometers.

13. The device of claim 1, wherein the epitaxial layer has a thickness in the range from about 1 micrometer to about 400 micrometers.

* * * * *